US005550392A

United States Patent [19]

Evans

[11] Patent Number: 5,550,392
[45] Date of Patent: Aug. 27, 1996

[54] SEMICONDUCTOR SWITCHING DEVICES

[75] Inventor: Michael Evans, Chippenham, England

[73] Assignee: Westinghouse Brake and Signal Holdings Limited, United Kingdom

[21] Appl. No.: 321,147

[22] Filed: Oct. 11, 1994

[30] Foreign Application Priority Data

Jan. 14, 1994 [GB] United Kingdom ................... 9400678

[51] Int. Cl.⁶ ...................................... H01L 29/744
[52] U.S. Cl. .......................... 257/170; 257/153; 257/138; 257/571; 257/623; 257/655
[58] Field of Search ..................... 257/170, 153, 257/571, 623, 655, 656, 138

[56] References Cited

U.S. PATENT DOCUMENTS 4,525,924  7/1985  Schafer ..................... 257/623

FOREIGN PATENT DOCUMENTS 57-64969   4/1982  Japan ..................... 257/170
62-147769  7/1987  Japan ..................... 257/153
62-290179 12/1987  Japan ..................... 257/153
2082836    3/1982  United Kingdom .

Primary Examiner—Jerome Jackson, Jr.
Attorney, Agent, or Firm—Darby & Darby, P.C.

[57] ABSTRACT

A process for manufacturing a semiconductor switching device (such as a thyristor device) comprises: etching a face of a semiconductor body to provide islands and channels which define a mesa-contoured surface; diffusing dopant of a first conductivity type through said surface so that the lines of equal concentration of the dopant in said body follow substantially the mesa-contoured surface; and diffusing dopant of a second conductivity type into said islands to form p-n junctions with said dopant of a first conductivity type. The diffusion of said dopant of a first conductivity type is followed by an out-diffusion step so that the dopant concentration of said dopant of a first conductivity type is at a maximum at a depth below said surface.

9 Claims, 4 Drawing Sheets

SEMICONDUCTOR SWITCHING DEVICES

BACKGROUND OF THE INVENTION

The present invention relates to semiconductor switching devices, such as thyristor devices, for example thyristor devices of the distributed or disseminated gate type or gate turn off (G.T.O.) thyristor devices.

Many prior art G.T.O. thyristor devices use a construction similar to that shown in section in FIG. 1. The principal features are, in a silicon disc 1, a p-diffused base region 2 (for example 50 μm thick) forming a planar junction 3 with a high resistivity n-base region 4 (for example about 450 μm thick). Channels 5 are etched into the p-base region 2 to leave raised islands 6 which are doped by a second diffusion to form n-type cathode emitter regions 7. The depth of the junctions 8 between regions 2 and 7 is important for two reasons:

(a) It must be arranged that the total dopant content of zones 2a (the zones of p-base region 2 underlying the cathode emitter regions 7) is held within a specific range; and (b) The dopant concentration in p-base region 2 adjacent each junction 8 must everywhere lie within specific limits to determine the reverse breakdown voltage of each junction 8 within an acceptable range. Ideally, junction breakdown should not occur along the lines of emergence 8a of junctions 8 at the silicon surface.

In an alternative form of prior art, a planar device as shown in FIG. 2 (in which items which correspond with items in FIG. 1 have the same reference numerals as in FIG. 1), omits the etched-out channels 5, so that outer surfaces 7a of cathode emitter regions 7 are coplanar with outer surface 9 of the p-diffused base region 2 (for example about 70 μm thick, the region 4 being for example about 450 μm thick). The p-base region 2 is provided with a reduced dopant concentration towards its outer surface 9. As a consequence, any breakdown of each junction 8 occurs within the bulk of the silicon around the locus 2 m of maximum base dopant concentration, though modified slightly by junction curvature effects.

In either prior art case, the silicon surface may be provided with an oxide coating in the vicinity of each junction emergence line 8a for reasons of protection and stability.

In the turn-off mode of operation of the device of FIG. 1, negative voltage is applied to each electrode 10 lying in electrical contact with the surface of p-base region 2, with respect to a cathode terminal plate 11 which contacts all of electrodes 11a which are in electrical contact with the outer surfaces of cathode emitter regions 7. This causes extraction of positive carriers (holes) from the p-base region 2 through electrodes 10 and correspondingly suppresses injection of negative carriers (electrons) from the cathode emitter regions 7 into p-base region 2. The negative voltage applied to electrodes 10 appears initially for the most part as a voltage drop across the lateral resistance $2r$ of region 2 between the zones 2a and the contact surfaces 10a of electrodes 10 and later, as the anode current density subsides, as a reverse bias (which may be limited by its avalanche breakdown voltage) at the junctions 8.

In practice, it has been found that the turn-off capability is significantly influenced by the uniformity of the lateral base resistance $2r$, which in turn is a function, inter alia, of the uniformity obtained in the depth to which the channels 5 are etched. It is also desirable that the effective value of resistance $2r$ is kept to a minimum, thus causing minimum impediment to the extraction of positive carriers from region 2.

Further, the uniformity of efficiency of contact at each surface 10a between electrodes 10 and the p-base region 2 is of similar importance, i.e. the contact resistance should be both uniform and minimal.

In practice, it is found that variation in the depths of channels 5 across the diameter of a disc causes non-uniformity of both the lateral resistance $2r$ and the efficiency of contact at surfaces 10a, with corresponding degradation of device performance compared to the optimum. The problems of uniformity become progressively more acute as device diameters are increased. Selective shallow p-type diffusion of relatively high surface concentration may be introduced into those parts of the surface of p-base region 2 directly underlying the contacts 10 to reduce and regulate the contact resistance at the cost of an additional process stage but is only a partial solution to the whole problem.

The device of FIG. 2 solves some of the problems of uniformity found in the device of FIG. 1 but at the cost of increased complexity in selectively contacting coplanar surface regions.

As prior art there may also be mentioned GB-A- 2 082 836, which discloses a semiconductor device, for example a p-i-n diode or a thyristor, which comprises a corrugated semiconductor body having a plurality of complementary grooves and ridges on opposite sides of the body. In the case of a p-i-n diode, the junction between the p-type region and intrinsic region extends substantially parallel to one surface, while the junction between the n-type region and the intrinsic region extends substantially parallel to the other surface. The object is to make the diode thinner without sacrificing strength and rigidity and to increase the active area and so the current handling capability. To avoid premature breakdown, the diode is surrounded by a thicker peripheral portion. In the case of a thyristor, there are p-n junctions, parallel electrodes and an annular electrode separated by insulation.

SUMMARY OF THE INVENTION

According to the present invention from one aspect, there is provided a process for manufacturing a semiconductor switching device, comprising:

etching a face of a semiconductor body to provide islands and channels which define a mesa-contoured surface;

diffusing dopant of a first conductivity type through said surface so that the lines of equal concentration of said dopant in said body follow substantially the mesa-contoured surface; and diffusing dopant of a second conductivity type into said islands to form p-n junctions with said dopant of a first conductivity type, wherein the diffusion of said dopant of a first conductivity type is followed by an out-diffusion step so that the dopant concentration of said dopant of a first conductivity type is at a maximum at a depth below said surface.

According to the present invention from another aspect, there is provided a semiconductor switching device comprising:

a semiconductor body having a face etched to provide islands and channels defining a mesa-contoured surface;

dopant of a first conductivity type in said body, the lines of equal concentration of said dopant in said body following substantially the mesa-contoured surface; and dopant of a second conductivity type in said islands and forming p-n junctions with said dopant of a first conductivity type, wherein said dopant of a first conductivity type has a maximum concentration at a depth below said surface.

Said depth may be in the range from about 5 to about 25 µm, such as from about 10 to about 15 µm and more particularly about 12 µm.

Said p-n junctions may occur at a depth below said surface which is substantially the same as, less than, or greater than the depth of the maximum of the dopant concentration of said dopant of a first conductivity type.

The semiconductor switching device could be a thyristor device, for example a thyristor device of the distributed or disseminated gate type or a G.T.O. thyristor device.

DETAILED DESCRIPTION

In the following example of a process for manufacturing a G.T.O. thyristor device, a device is manufactured with a mesa-contoured surface, in which: cathode emitter islands can be contacted effectively by a planar cathode plate; the lateral base resistance is low, uniform and not significantly influenced by the depth of the mesa etching; the gate-cathode reverse avalanche breakdown is of a sufficient and uniform voltage; and avalanche breakdown takes place away from the mesa-contoured surface.

In the following example, the mesa-contoured surface is provided by etching into a disc comprising a high resistivity n-type silicon slice as a first operation, followed by the principal p-type diffusion at least on the cathode (etched) face, further followed by the selective diffusion of phosphorus into the surfaces of the unetched islands in the cathode face.

The result of this sequence is that the original surface of the p-type diffusion, which should have a uniform concentration except for where it has been selectively further diffused with phosphorus, has been everywhere preserved, in contrast to the mesa process of the above prior art where the mesa profiling, performed after the principal p-type diffusion, has removed the original surface in the etched areas with the disadvantageous consequences described.

The diffusions and masking stages performed on the opposing anode face of the silicon disc may take any of the forms already known in the art according to whether the type of device required is reverse-blocking, anode emitter shorted, etc.

In order to secure the advantages of avoiding reverse cathode emitter bias breakdown at the external surface, a p-base diffusion profile giving maximum dopant concentration at some depth inside the silicon is arranged by using a degree of out diffusion in the latter part of the p-base diffusion process.

Figure 3A:
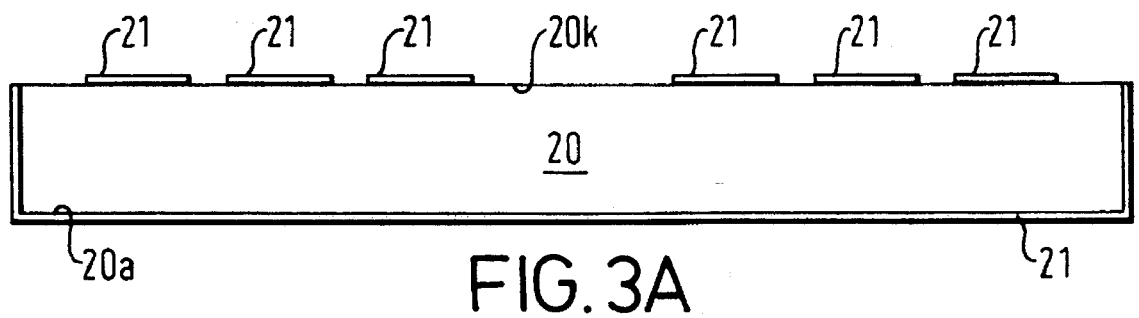
FIGS. 3A, 3B, 3C, 3D and 3E show steps in an example of a process according to the present invention.
Figure 3B:
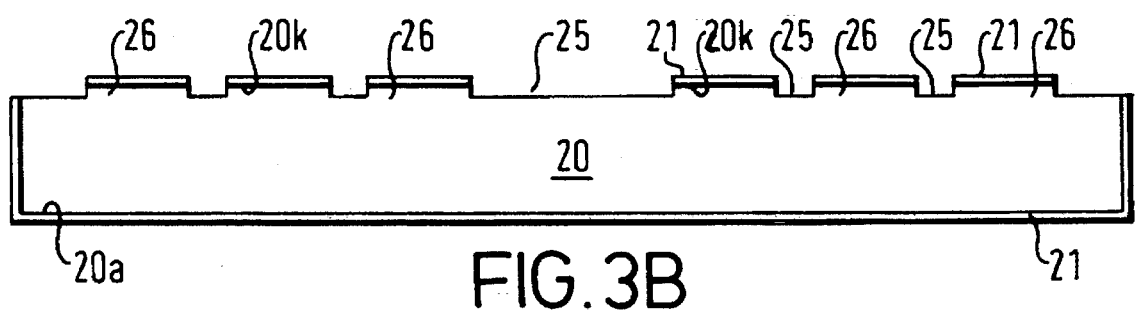
Figure 4:
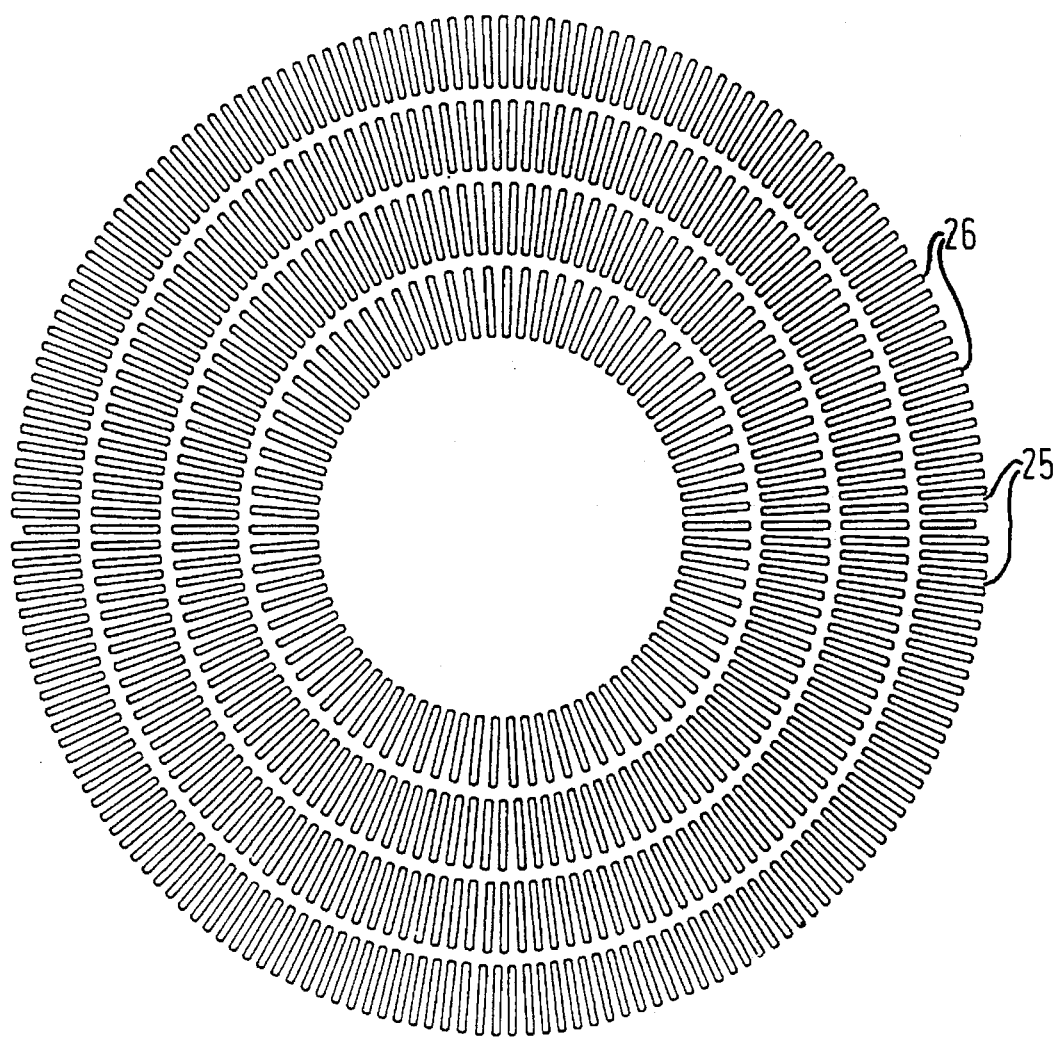
FIG. 4 is a plan view of the cathode emitter pattern of an example of a thyristor device according to the present invention.

Referring to FIG. 3A, a disc 20 of silicon, (120 Ω.cm (approximately) n-type, 38 mm in diameter and 600 µm thick) is masked by masking 21 all over a lower face 20a and selectively on the opposite, upper face 20k using standard photo-lithographic methods so as to be resistant to acid attack at the masked areas. It is then etched in a mixture of hydrofluoric, nitric and acetic acids to a depth of about 18 µm, to produce a relief pattern of etched channels 25 and masked islands 26 on the selectively masked face (see FIG. 3B) so that the islands and channels define a mesa-contoured surface. The pattern of channels 25 and islands 26 in plan view is as shown in FIG. 4, being one of concentrically arranged arrays of essentially radially-orientated islands 26.

Figure 5:
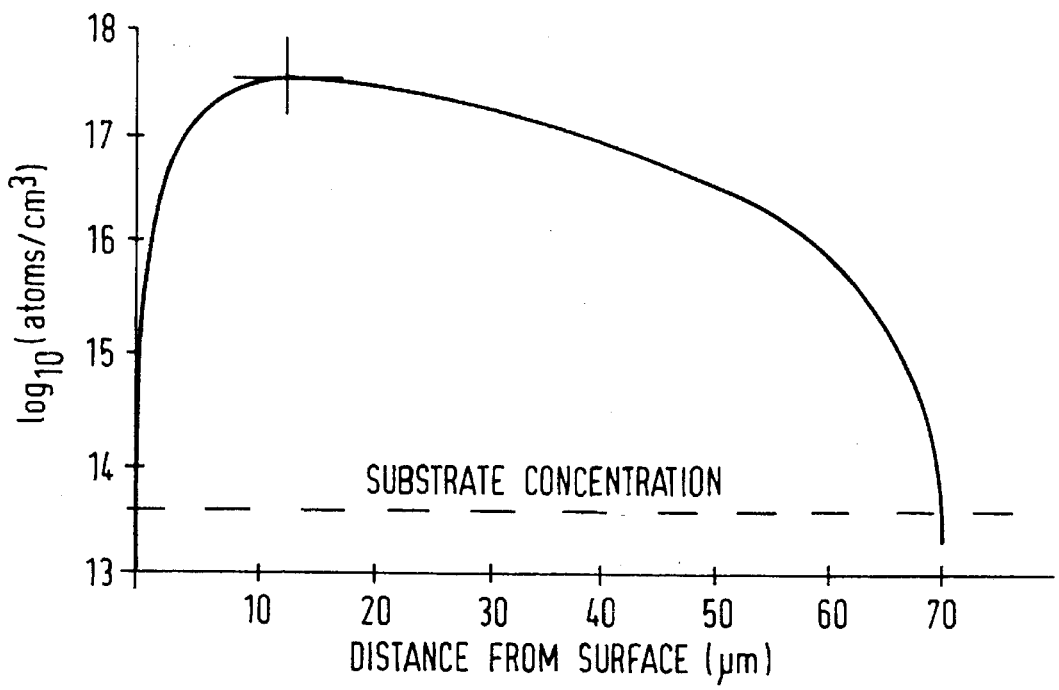
FIG. 5 shows the diffusion concentration/depth profile of the p-diffusion in the example of a process according to the present invention.

The disc 20 is then completely unmasked and doped with a gallium p-type diffusion to produce a p-n junction 23 at a depth of approximately 70 µm from the mesa-contoured surface. The surface concentration of the dopant species is reduced after a certain time in order to produce a maximum concentration of dopant as a result of out-diffusion at a depth of about 12 µm. (The production of a diffusion/depth profile with a maximum concentration in the body of a substrate is a known technique—see for example U.S. Pat. No. 4,605, 451.) A typical diffusion profile for the gallium is shown in FIG. 5, in which the dopant concentration is plotted against distance from the mesa-contoured surface. The lines of equal concentration of the gallium p-type dopant follow substantially the mesa-contoured surface.

Figure 1:
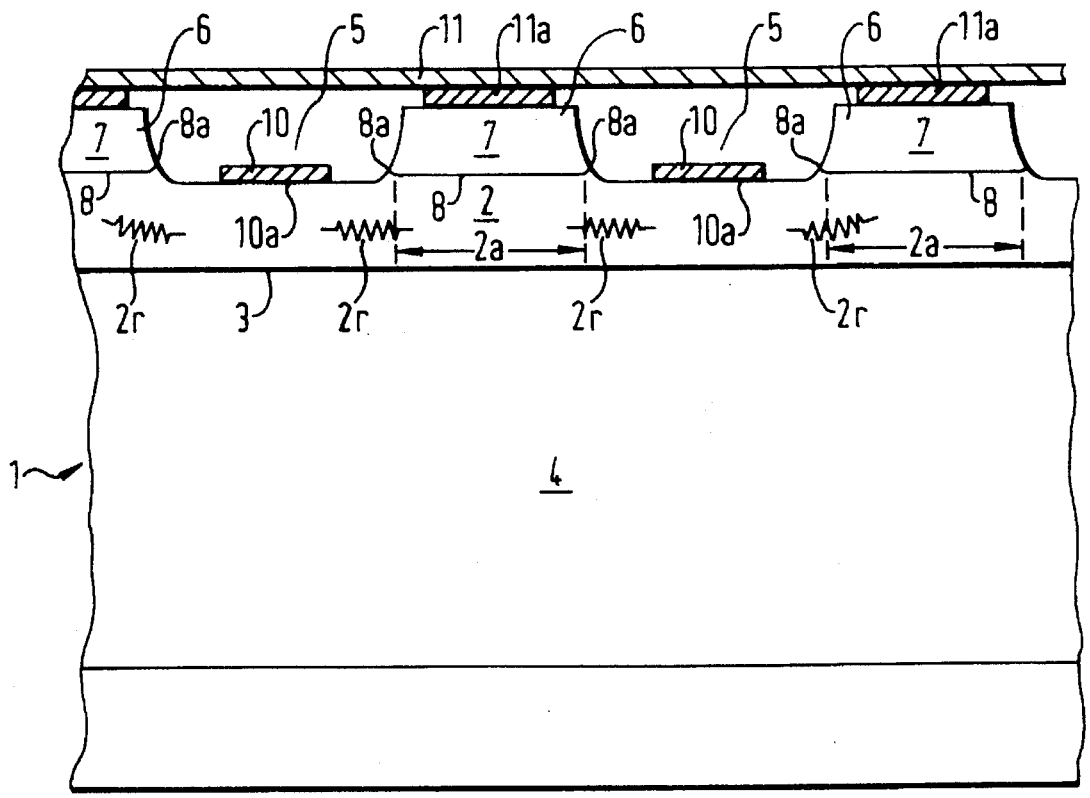
FIGS. 1 and 2 are sections through parts of prior art G.T.O. thyristor devices.
Figure 2:
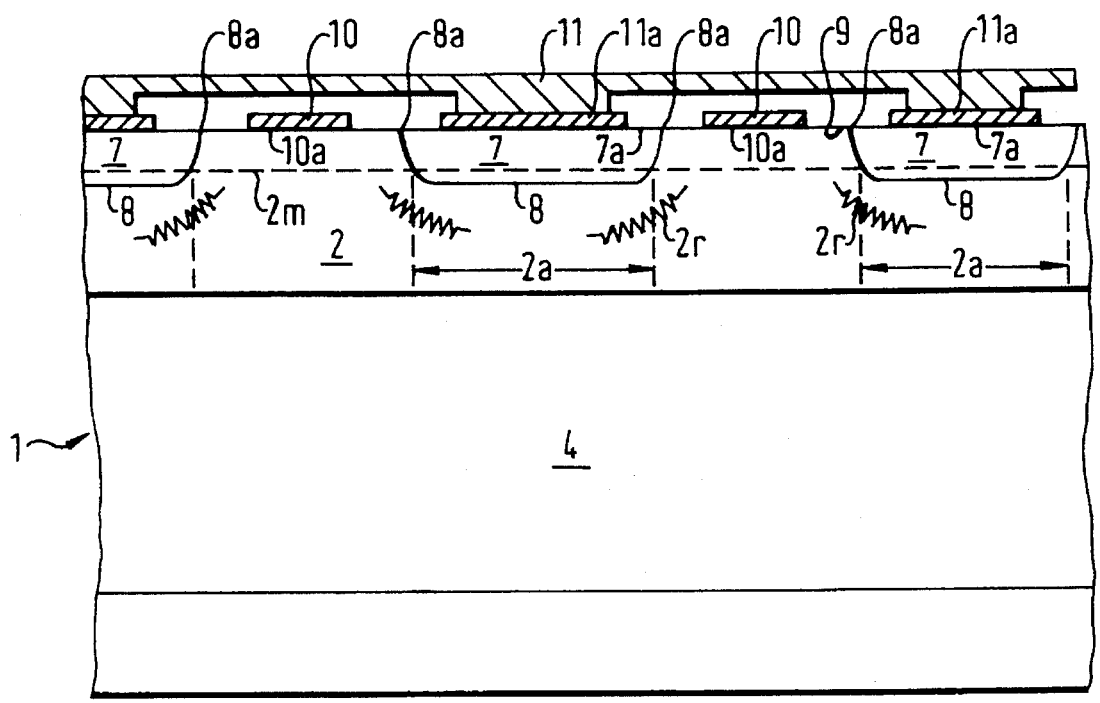
Figure 3C:
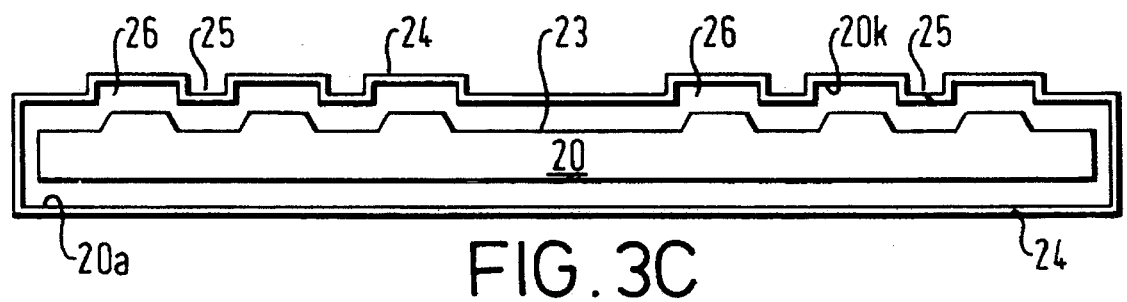
Figure 3D:
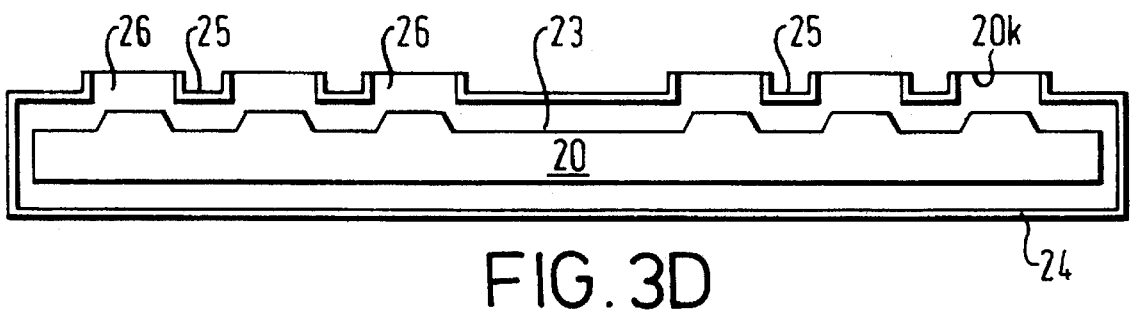
Figure 3E:
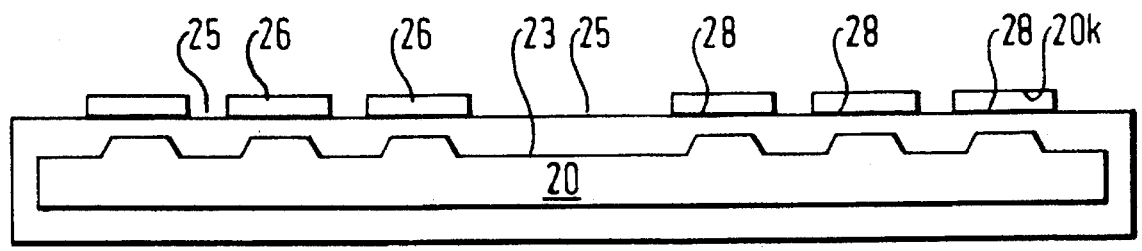

The disc 20 is then provided all over with an oxide layer 24 (see FIG. 3C) by processing in wet nitrogen at 1200° C. until the oxide thickness achieved is about 1.8 µm. A mask, essentially a negative of that used for the production of the mesa pattern of raised islands, is applied to the cathode surface and a blanket mask over the anode surface and the oxide layer 24 etched away on the unmasked surfaces of islands 26 (see FIG. 3D). Phosphorus is deposited and diffused into these unmasked islands and after overall removal of the oxide layer 24, is driven to give cathode emitter p-n junctions 28 at a depth of approximately 18 µm (see FIG. 3E) in a further oxidising atmosphere, thus growing a new surface oxide (not shown). Windows are etched in the new surface oxide to permit the deposition of metal contacts similar to contacts 10 and 11a of FIG. 1.

Control of the injection efficiency of the cathode emitter junctions 28 is typically achieved by measurement and control of the capacitance of the junctions 28 (formed between the phosphorous and gallium diffused profiles). The reverse breakdown voltage of these junctions is found to be relatively independent of all factors other than the peak concentration of the gallium diffusion profile.

Figure 6:
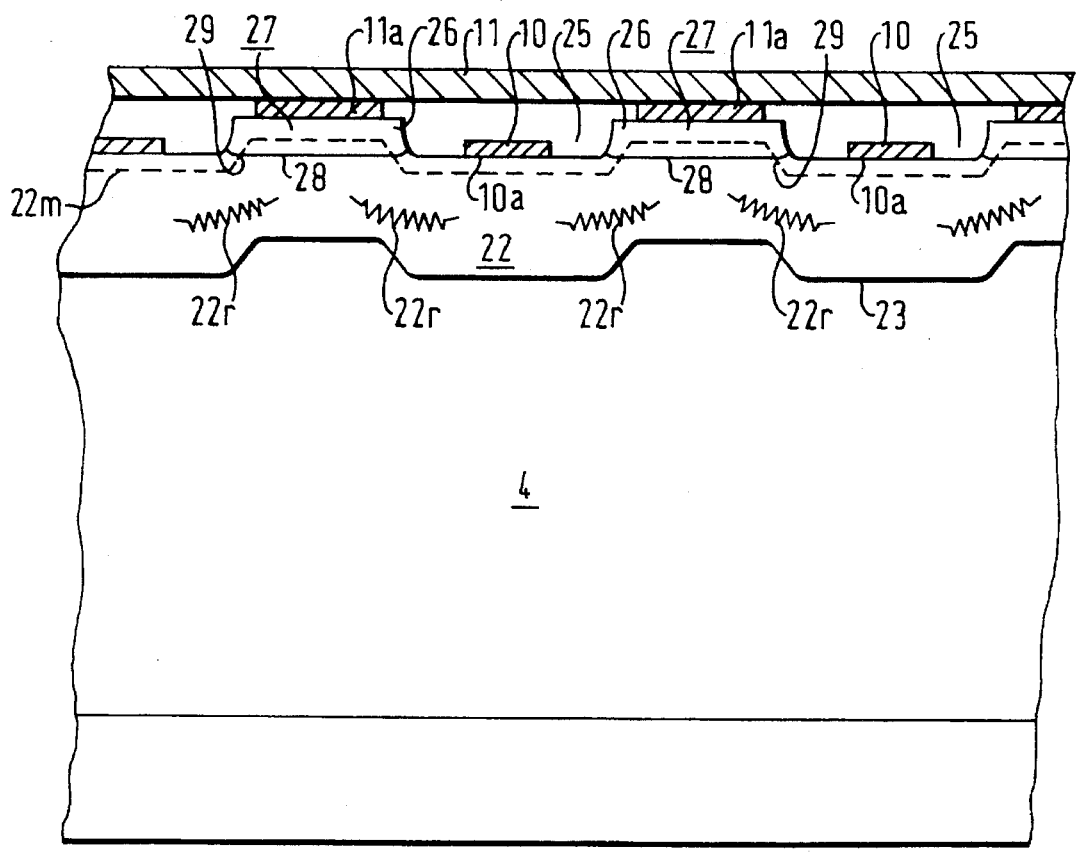
FIG. 6 is a section through part of an example of a thyristor device according to the present invention.

The form of the junction arrangement resulting from the above process is shown more clearly in FIG. 6. The p-n junction 23 formed by the diffusion of the gallium into the high resistivity n-type region 4 (whose thickness is about 450 µm), now follows substantially the profile of the mesa-contoured surface of the silicon disc defined by the etched channels 25 and raised islands 26. The depth of the second, n-type diffusion to form cathode emitter regions 27 is preferably made substantially the same as, but may be either greater (as described in the foregoing example and shown in FIG. 6) or less than the depth of maximum concentration of gallium p-type dopant in p-base region 22, represented by the broken line 22m. The out diffused p-type diffusion profile ensures that the lowest avalanche breakdown voltage at a cathode emitter p-n junction 28 occurs either consistently at the line 29 where the cathode emitter p-n junction 28 intersects the line of maximum gallium concentration 22m or, if no such intersection occurs, then generally in the region of nearest approach. If, due to slight displacement of cathode emitter regions 27, the junctions 28 are formed somewhat further into the channels 25 in some places than in others, the line 22m of maximum gallium concentration will still ensure a relatively uniform avalanche breakdown voltage. Furthermore, since the line 22m nowhere reaches the surface of the silicon where cathode emitter regions 27 are formed, the junction breakdown is always some distance from the surface, an advantage which will be readily appreciated by those skilled in the art.

Diffused p-base region 22 has not been diminished in thickness by the etching of the mesa channels 25, and consequently its lateral resistance 22r is no longer a function of the depth of such etching, nor is the magnitude of 22r raised thereby. Hence, compared to the lateral resistance 22r of the device of FIG. 1, the resistance 22r is both lower and more uniform. A still further advantage is that the surfaces 10a to which the gate electrodes 10 are attached are of uniform surface resistivity, ensuring more uniform contact properties.

Although the mesa channels 25 are put into the silicon before the principal p-type diffusion step, this might not necessarily be the first p-type diffusion step as it is possible to produce the junction 23 using a lower concentration and a deep profile (e.g. employing aluminium as a dopant) before diffusing a second p-type dopant of higher concentration and providing the major part of the p-base conductivity. In such a case, the formation of the mesa channels 25 would be between the steps of applying the first and second p-type dopant steps and junction 23 would then be planar in form, the lines of equal concentration of the second p-type dopant following substantially the mesa-contoured surface.

Although the present invention has been described by way of example with reference to a G.T.O. thyristor device, it is not limited to the same. For example, the present invention may be applied to other kinds of thyristor device, such as thyristor devices of the distributed or disseminated gate type, or to transistors, such as high power transistors. While the present invention provides advantages in respect of G.T.O. thyristor devices, advantages may be obtained also elsewhere in the field of thyristor devices in which contact design can be simplified by the adoption of mesa techniques, or in the field of transistors. In such cases, the respective uniformity of turn-on or base current distribution can be improved without the need for additional diffusion to boost or regulate the dopant surface concentration in the surface contact area(s) of the base region.

What is claimed is:

1. A semiconductor switching device containing dopants of first and second conductivity types comprising:
   a semiconductor body of said second conductivity type having a face etched to provide islands and channels defining a mesa-contoured surface;
   dopant of said first conductivity type in said body forming a first p-n junction at a pre-selected depth below the mesa-contoured surface, said dopant having surfaces of equal concentration in said body following substantially the mesa-contoured surface; and dopant of said second conductivity type in said islands to form second p-n junctions with said dopant of said first conductivity type;
   wherein said dopant of said first conductivity type has a surface of maximum concentration in said body following substantially the mesa-contoured surface, said surface of maximum concentration being closer to the mesa-contoured surface than to the first p-n junction.

2. A device according to claim 1, wherein said surface of maximum concentration is located at a depth in the range from about 5 to about 25 μm below the mesa-contoured surface.

3. A device according to claim 2, wherein said depth is in the range from about 10 to about 15 μm.

4. A device according to claim 3, wherein said depth is about 12 μm.

5. A device according to claim 1, wherein said second p-n junctions occur at a depth below said surface which is substantially the same as the depth of the maximum of the dopant concentration of said dopant of a first conductivity type.

6. A semiconductor switching device comprising:
   a semiconductor body having a face etched to provide islands and channels defining a mesa-contoured surface;
   dopant of a first conductivity type diffused into said body to form lines of equal concentration of said dopant in said body following substantially the mesa-contoured surface; and
   dopant of a second conductivity type diffused into said islands to form p-n junctions with said dopant of a first conductivity type, wherein said dopant of a first conductivity type has a maximum concentration at a depth below said surface; and
   wherein said p-n junctions occur at a depth below said surface which is less than the depth of the maximum of the dopant concentration of said dopant of a first conductivity type.

7. A semiconductor switching device comprising:
   a semiconductor body having a face etched to provide islands and channels defining a mesa-contoured surface;
   dopant of a first conductivity type diffused into said body to form lines of equal concentration of said dopant in said body following substantially the mesa-contoured surface; and
   dopant of a second conductivity type diffused into said islands to form p-n junctions with said dopant of a first conductivity type, wherein said dopant of a first conductivity type has a maximum concentration at a depth below said surface; and
   wherein said p-n junctions occur at a depth below said surface which is greater than the depth of the maximum of the dopant concentration of said dopant of a first conductivity type.

8. A device according to claim 1, which is a thyristor device.

9. A device according to claim 8, which is a gate turn off thyristor device.

* * * * *